United States Patent
Kang et al.

(10) Patent No.: US 9,978,983 B2
(45) Date of Patent: May 22, 2018

(54) ORGANIC LIGHT-EMITTING DEVICE

(71) Applicant: LG DISPLAY CO., LTD., Seoul (KR)

(72) Inventors: Minsoo Kang, Daejeon (KR); Seongsu Jang, Daejeon (KR); Young Kyun Moon, Daejeon (KR); Sung Soo Park, Daejeon (KR); Cheol Hyeon Kim, Daejeon (KR)

(73) Assignee: LG DISPLAY CO., LTD., Seoul (KR)

(*) Notice: Subject to any disclaimer, the term of this patent is extended or adjusted under 35 U.S.C. 154(b) by 0 days. days.

(21) Appl. No.: 15/307,325

(22) PCT Filed: May 4, 2015

(86) PCT No.: PCT/KR2015/004484
§ 371 (c)(1),
(2) Date: Oct. 27, 2016

(87) PCT Pub. No.: WO2015/174676
PCT Pub. Date: Nov. 19, 2015

(65) Prior Publication Data
US 2017/0047540 A1 Feb. 16, 2017

(30) Foreign Application Priority Data
May 13, 2014 (KR) .................. 10-2014-0057288

(51) Int. Cl.
| H01L 51/52 | (2006.01) |
| H01L 51/56 | (2006.01) |
| H01L 51/00 | (2006.01) |
| H01L 27/32 | (2006.01) |

(52) U.S. Cl.
CPC ...... *H01L 51/5228* (2013.01); *H01L 27/3223* (2013.01); *H01L 51/0027* (2013.01); *H01L 51/5212* (2013.01); *H01L 51/5253* (2013.01); *H01L 51/56* (2013.01); *H01L 2251/5338* (2013.01); *H01L 2251/5392* (2013.01); *H01L 2251/568* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS

| 7,911,133 | B2 | 3/2011 | Tyan et al. |
| 7,964,416 | B2 * | 6/2011 | Miyazawa .......... H01L 27/3244 |
| | | | 257/E51.018 |
| 8,421,347 | B2 | 4/2013 | Yamagishi et al. |
| 9,397,315 | B2 * | 7/2016 | Wang .................. H01L 51/5281 |
| 2004/0202777 | A1 | 10/2004 | Nishikawa et al. |
| 2008/0278067 | A1 | 11/2008 | Tyan et al. |
| 2010/0018956 | A1 | 1/2010 | Watts et al. |
| 2011/0012135 | A1 | 1/2011 | Chen et al. |
| 2011/0193066 | A1 | 8/2011 | Parker et al. |
| 2012/0164761 | A1 | 6/2012 | Yamazaki et al. |

(Continued)

FOREIGN PATENT DOCUMENTS

| CN | 101682001 A | 3/2010 |
| EP | 2102906 A1 | 9/2009 |

(Continued)

*Primary Examiner* — Quoc Hoang
(74) *Attorney, Agent, or Firm* — Dentons US LLP

(57) ABSTRACT

The present specification provides an organic light emitting device.

17 Claims, 7 Drawing Sheets

(56) References Cited

U.S. PATENT DOCUMENTS

| | | |
|---|---|---|
| 2013/0334506 A1 | 12/2013 | Tobise et al. |
| 2014/0008625 A1 | 1/2014 | Hiraoka et al. |
| 2014/0209891 A1 | 7/2014 | Hiraoka et al. |
| 2014/0306214 A1 | 10/2014 | Leet et al. |

FOREIGN PATENT DOCUMENTS

| | | |
|---|---|---|
| JP | 2001-196191 A | 7/2001 |
| JP | 2002-206857 A | 7/2002 |
| JP | 2004-227852 A | 8/2004 |
| JP | 2012-018867 A | 1/2012 |
| JP | 2013-251067 A | 12/2013 |
| KR | 10-2012-0055534 A | 5/2012 |
| TW | 200850053 A | 12/2008 |
| TW | 201105164 A1 | 2/2011 |
| TW | 201414035 A | 4/2014 |
| WO | 2013/038450 A1 | 8/2004 |

\* cited by examiner

ORGANIC LIGHT-EMITTING DEVICE

This application is a National Stage Application of International Application No. PCT/KR2015/004484, filed on May 4, 2015, and claims the benefit of Korean Patent Application No. 10-2014-0057288, filed on May 13, 2014, the contents of which are incorporated herein by reference in their entirety for all purposes as if fully set forth below.

TECHNICAL FIELD

The present specification claims priority to and the benefits of Korean Patent Application No. 10-2014-0057288, filed with the Korean Intellectual Property Office on May 13, 2014, the entire contents of which are incorporated herein by reference.

The present specification relates to an organic light emitting device.

BACKGROUND ART

An organic light emission phenomenon refers to a phenomenon converting electrical energy to light energy using an organic material. In other words, when a proper organic material layer is placed between an anode and a cathode and a voltage is applied between the two electrodes, holes and electrons are injected to the organic material layer from the anode and the cathode, respectively. These injected holes and electrons meet to form excitons, and light emits when these excitons fall back to the ground state.

An organic light emitting device is likely to have short defects since space between an anode and a cathode is small. By pin holes, cracks, steps in the structure of an organic light emitting device, coating roughness and the like, an anode and a cathode may be in direct contact with each other, or an organic layer thickness may be made to be thinner in these defect regions. These defect regions provide a low-resistance path that allows a current flow, and make the flow hardly flowing or not flowing at all in extreme cases through an organic light emitting device. As a result, the organic light emitting device has reduced or no light emission output. In multi-pixel display devices, short defects may decline display qualities by producing dead pixels that do not emit light or emit light having intensity less than average light intensity. In illumination or other low-resolution applications, a considerable portion of the corresponding region may not operate due to short defects. With concerns for short defects, manufacture of an organic light emitting device is typically carried out in a clean room. However, no matter how clean the environment is, it cannot be effective in removing short defects. In many cases, the thickness of an organic layer increases more than actually needed to operate a device in order to decrease the number of short defects by increasing a distance between two electrodes. Such a method adds costs in manufacturing an organic light emitting device, and short defects may not even be completely removed using such a method.

DISCLOSURE

Technical Problem

The present specification relates to an organic light emitting device.

Technical Solution

One embodiment of the present specification provides an organic light emitting device including a first electrode that includes two or more conductive units; a second electrode provided opposite to the first electrode; one or more organic material layers provided between the first electrode and the second electrode; and a function deprived area continued from a part of at least one of the conductive units to a part of the second electrode, wherein the function deprived area is at least one of the first electrode and the second electrode losing the function or being physically removed.

One embodiment of the present specification provides a display device including the organic light emitting device.

One embodiment of the present specification provides an illumination device including the organic light emitting device.

Advantageous Effects

An organic light emitting device according to one embodiment of the present specification may normally operate by repairing a region in which a leakage current occurs due to short defects.

In addition, an organic light emitting device according to one embodiment of the present specification repairs a short defect region in a minimum range, and therefore, has an advantage in that the repaired region is not readily detected with the naked eye when driving the organic light emitting device.

MODE FOR DISCLOSURE

Figure 1:
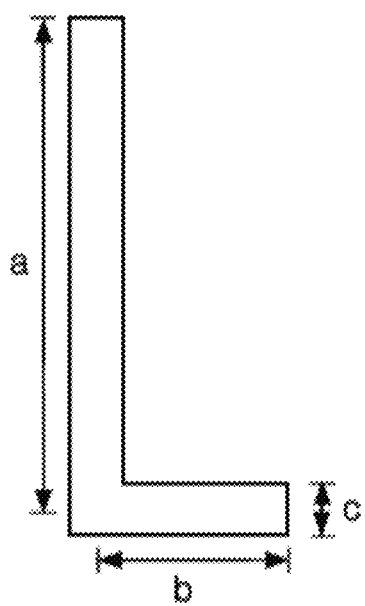
FIG. 1 illustrates one example of a length and a width in a conductive connection of the present specification.

In the present specification, a description of one member being placed "on" another member includes not only a case of the one member adjoining the another member but a case of still another member being present between the two members.

In the present specification, a description of a certain part "including" certain constituents means capable of further including other constituents, and does not exclude other constituents unless particularly stated on the contrary.

Hereinafter, the present specification will be described in more detail.

One embodiment of the present specification provides an organic light emitting device including a first electrode that includes two or more conductive units; a second electrode provided opposite to the first electrode; one or more organic material layers provided between the first electrode and the second electrode; and a function deprived area continued from a part of at least one of the conductive units to a part of the second electrode, wherein the function deprived area is at least one of the first electrode and the second electrode losing the function or being physically removed.

According to one embodiment of the present specification, the function deprived area may include a region having the shortest distance from some regions of the conductive unit to the second electrode.

According to one embodiment of the present specification, the organic material layer in the function deprived area may be removed, and may be substituted with an oxide of the first electrode or second electrode.

According to one embodiment of the present specification, the function deprived area may be formed by laser irradiation.

According to one embodiment of the present specification, the function deprived area may be formed by laser irradiation or by artificially applying an overcurrent.

The function deprived area may prevent a leakage current caused by a short defect region by depriving a first electrode, a second electrode or an organic material layer located within the short defect region occurring while manufacturing an organic light emitting device. Specifically, according to one embodiment of the present specification, the function deprived area may not be electrically connected to adjacent regions. Accordingly, the function deprived area is capable of blocking a leakage current.

According to one embodiment of the present specification, the organic light emitting device may include an auxiliary electrode electrically connected to each of the conductive units, and may include a short circuit preventing unit provided between the auxiliary electrode and each of the conductive units to electrically connect the auxiliary electrode and each of the conductive units.

According to one embodiment of the present specification, resistance from a region of the short circuit preventing unit adjacent to the auxiliary electrode to a region adjacent to each of the conductive units may be greater than or equal to 40Ω and less than or equal to 300,000Ω.

The short circuit preventing unit of the present specification may have relatively higher resistance compared to the conductive unit. Moreover, the short circuit preventing unit of the present specification may perform a short circuit preventing function in the organic light emitting device. In other words, when short defects occur in an organic light emitting device, the short circuit preventing unit of the present specification performs a role of enabling the operation of the device despite the short defects.

Short defects may occur when a second electrode is directly in contact with a first electrode. Alternatively, short defects may also occur when an organic material layer loses the function due to a thickness decrease, deformation or the like of the organic material layer located between a first electrode and a second electrode, and the first electrode is in contact with the second electrode. When short defects occur, a low path is provided to the current of an organic light emitting device current, and the organic light emitting device may not normally operate. Due to a leakage current in which a current directly flows from a first electrode to a second electrode due to short defects, the current of an organic light emitting device may flow avoiding a defectless area. This may decrease light emission output of the organic light emitting device, and in many cases, the organic light emitting device may not operate. In addition, when a current used to dispersively flow to a large area of organic materials flows intensively on a short circuit occurring location, high heat is generated locally causing a risk of device breakage or fire.

However, all operating currents flowing to a short defect region may be prevented by the short circuit preventing unit even when short defects occur in any one or more of the conductive units of the organic light emitting device of the present specification. In other words, the short circuit preventing unit may perform a role of controlling the quantity of a leakage current so that it does not increase infinitely. Accordingly, in the organic light emitting device of the present specification, the remaining conductive units having no short defects may normally operate even when short defects occur in some of the conductive units.

A current may be supplied to each of the conductive units of the present specification through a region having a short circuit preventing function. Specifically, according to one embodiment of the present specification, the organic light emitting device may be electrically connected to the auxiliary electrode through one or more short circuit preventing units provided between the conductive unit and the auxiliary electrode. Specifically, according to one embodiment of the present specification, each of the conductive units may be electrically connected to the auxiliary electrode through short circuit preventing units present in greater than or equal to 1 and less than or equal to 10. When the short circuit preventing unit electrically connected to any one conductive unit is present in plural numbers, stability of an organic light emitting device may increase since other short circuit preventing units may function even when any one short circuit preventing unit does not function.

According to one embodiment of the present specification, resistance from the auxiliary electrode to each of the conductive units may be resistance of the short circuit preventing unit. Specifically, resistance of the auxiliary electrode is small and negligible, therefore, most resistance from the auxiliary electrode to the conductive unit may be resistance of the short circuit preventing unit.

The conductive unit of the present specification may be included in a light emitting region of the organic light emitting device. Specifically, according to one embodiment of the present specification, at least one region of each of the conductive units may be located in a light emitting region of the organic light emitting device. In other words, according to one embodiment of the present specification, a light emission phenomenon occurs in an organic material layer including a light emitting layer formed on a region forming the conductive unit, and light may emit through the conductive unit.

According to one embodiment of the present specification, the organic light emitting device may have a current flow in a directional order of an auxiliary electrode, a short circuit preventing layer, a conductive unit, an organic material layer and a second electrode, or in a directional order reverse thereto. Alternatively, the organic light emitting device may have a current flow in a directional order of an auxiliary electrode, a conductive connection, a conductive unit, an organic material layer and a second electrode, or in a reverse directional order thereto.

According to one embodiment of the present specification, a current may be supplied to each of the conductive units from the auxiliary electrode through the short circuit preventing unit.

The light emitting region in the present specification means a region in which light emitting at a light emitting layer of an organic material layer emits through a first electrode and/or a second electrode. For example, in the organic light emitting device according to one embodiment of the present specification, the light emitting region may be formed in at least some of the first electrode region in which a short circuit preventing unit and/or an auxiliary electrode are not formed among the regions in which the first electrode is formed on a substrate. In addition, a non-light emitting region in the present specification may mean the remaining regions excluding the light emitting region.

According to one embodiment of the present specification, the short circuit preventing unit may be located in a non-light emitting region of the organic light emitting device.

According to one embodiment of the present specification, each of the conductive units may be electrically parallel connected. The conductive units of the present specification may be disposed to be separated from each other. The constitution of the conductive units of the present specification being separated from each other may be identified by the resistance between the conductive units.

Specifically, according to one embodiment of the present specification, resistance from one of the conductive units to neighboring another conductive unit may be twice or greater than resistance of the short circuit preventing unit. For example, when a current carrying path between any one conductive unit and neighboring another conductive unit is made only through a short circuit preventing unit and an auxiliary electrode, the conductive unit and the adjacent conductive unit go through the auxiliary electrode and the short circuit preventing unit twice. Accordingly, resistance between the conductive units may have a resistance value at least twice the value of the short circuit preventing unit even when ignoring a resistance value of the auxiliary electrode.

Each of the conductive units of the present specification is separated from each other and is electrically separated, and a current may be supplied to each of the conductive units from the auxiliary electrode through the short circuit preventing unit. This is for preventing the whole organic light emitting device not operating, when a short circuit occurs in any one conductive unit, by a current having to flow to another unit not experiencing a short circuit flows to the conductive unit experiencing a short circuit.

According to one embodiment of the present specification, the first electrode may include two or more conductive units, and the two or more conductive units may be disposed to be physically separated from each other. In addition, according to one embodiment of the present specification, the two or more conductive units may be physically connected to each other, and in this case, the two or more conductive units may be connected to each other through a region of the first electrode in which the conductive units are not formed.

According to one embodiment of the present specification, the auxiliary electrode may have sheet resistance of 3Ω/□ or less. Specifically, the auxiliary electrode may have sheet resistance of 1Ω/□ or less.

When sheet resistance of any one of a first electrode and a second electrode having a large area is higher than is needed, voltages may be different for each location of the electrode. As a result, when a potential difference between the first electrode and the second electrode placing an organic material layer in between becomes different, brightness uniformity of an organic light emitting device may decrease. Accordingly, in order to lower the sheet resistance of the first electrode or the second electrode having higher sheet resistance than is needed, an auxiliary electrode may be used. The sheet resistance of the auxiliary electrode of the present specification may be 3Ω/□ or less, and specifically 1Ω/□ or less, and in the above-mentioned range, the organic light emitting device may maintain high brightness uniformity.

According to one embodiment of the present specification, the first electrode may be formed as a transparent electrode. In this case, sheet resistance of the first electrode may be higher than sheet resistance required for the operation of the organic light emitting device. Accordingly, in order to lower the sheet resistance of the first electrode, the sheet resistance of the first electrode may be lowered to the sheet resistance level of the auxiliary electrode by electrically connecting the auxiliary electrode to the first electrode.

According to one embodiment of the present specification, the auxiliary electrode may be provided in a region other than a light emitting region.

According to one embodiment of the present specification, the auxiliary electrode may be formed with conductive lines electrically connected to each other. Specifically, the conductive lines may be formed with conductive units. Specifically, the whole auxiliary electrode may be driven by applying a voltage to at least one region of the auxiliary electrode of the present specification.

According to one embodiment of the present specification, the organic light emitting device may be used as being included in OLED illumination. In the case of the OLED illumination, light emission with uniform brightness in the whole light emitting region, that is, in all the organic light emitting devices, is important. Specifically, in order to accomplish uniform brightness in the OLED illumination, voltages formed between the first electrode and the second electrode of all the organic light emitting devices included in the OLED illumination are preferably maintained to be the same.

When the first electrode of the present specification is a transparent electrode, and the second electrode is a metal electrode, the second electrode of each organic light emitting device has sufficiently low sheet resistance, and there is almost no voltage difference in the second electrode of each of the organic light emitting devices, however, in the case of the first electrode, a voltage difference may exist in each of the organic light emitting devices. According to one embodiment of the present specification, the auxiliary electrode, and specifically, a metal auxiliary electrode, may be used in order to complement the first electrode voltage difference of each of the organic light emitting devices. Moreover, the metal auxiliary electrode is formed with conductive lines electrically connected to each other, and the first electrode voltage difference of the each organic light emitting device hardly exists.

According to one embodiment of the present specification, the conductive unit may have sheet resistance of 1Ω/□ or greater, or 3Ω/□ or greater, and specifically, may be 10Ω/□ or greater. In addition, the conductive unit may have sheet resistance of 10,000Ω/□ or less, or 1,000Ω/□ or less. In other words, the conductive unit of the present specification may have sheet resistance of greater than or equal to 1Ω/□ and less than or equal to 10,000Ω/□, or greater than or equal to 10Ω/□ and less than or equal to 1,000Ω/□.

The conductive unit and the conductive connection are formed by patterning the first electrode, and therefore, the conductive unit may have the same sheet resistance as the first electrode or the conductive connection.

According to one embodiment of the present specification, the sheet resistance level required for the conductive unit may be controlled so as to be inversely proportional to an area of the conductive unit corresponding to a light emitting area. For example, when the conductive unit has a light emitting area of 100 cm², the sheet resistance required for the conductive unit may be approximately 1Ω/□. Moreover, when each of the conductive units is formed to be small, the sheet resistance required for the conductive unit may be 1Ω/□ or greater.

The sheet resistance of the conductive unit of the present specification may be determined by materials forming the conductive unit, and may also be lowered to a sheet resistance level of an auxiliary electrode by being electrically connected to the auxiliary electrode. Accordingly, the sheet resistance value of the conductive unit required in the organic light emitting device of the present specification may be adjusted by the materials of the auxiliary electrode and the conductive unit.

According to one embodiment of the present specification, the first electrode may include 1,000 or more of the conductive units separated from each other. Specifically, the first electrode may include greater than or equal to 1,000 and less than or equal to 1,000,000 of the conductive units separated from each other.

In addition, according to one embodiment of the present specification, the first electrode may be formed with patterns of two or more of the conductive units. Specifically, the conductive unit may be formed with patterns in which regions excluding the conductive connection are separated from each other.

The pattern of the present specification may have the shape of a closed figure. Specifically, the pattern may be a polygon such as a triangle, a quadrangle and a hexagon, or may be an amorphous form.

When the number of the conductive units of the present specification is 1,000 or greater, an effect of the organic light emitting device minimizing a leakage current quantity during the occurrence of a short circuit while minimizing a voltage increase during normal operation may be obtained. In addition, as the number of the conductive units of the present specification increases up to 1,000,000 or less, the effect may be maintained while maintaining an aperture ratio. In other words, when the number of the conductive units is greater than 1,000,000, a decrease in the aperture ratio may occur due to the increase in the number of auxiliary electrodes.

According to one embodiment of the present specification, the area the conductive units occupy in the organic light emitting device may be greater than or equal to 50% and less than or equal to 90% based on the plane diagram of the whole organic light emitting device. Specifically, the conductive unit is included in a light emitting region, and the area the conductive units occupy may be the same as or similar to an aperture ratio of the organic light emitting device based on the light emitting surface of the whole organic light emitting device.

In the first electrode of the present specification, each of the conductive units is electrically connected by the conductive connection and/or the short circuit preventing layer, and therefore, a driving voltage of a device increases. Therefore, according to one embodiment of the present specification, the first electrode may have a short circuit preventing function by the conductive connection while lowering a driving voltage of the device by including 1,000 or more of the conductive units in order to complement a driving voltage increase by the conductive connection.

According to one embodiment of the present specification, an area of each of the conductive units may be greater than or equal to 0.01 mm$^2$ and less than or equal to 25 mm$^2$.

When an area of each of the conductive units is made to be small, there is an advantage in that both an operating voltage increase rate due to the short circuit preventing unit introduced for preventing a short circuit, and a leakage current value with respect to an operating current are lowered. In addition, there is an advantage in that product quality decline may be minimized by minimizing a non-light emitting region when a conductive unit in which light does not emit due to a short circuit is generated. However, when an area of the conductive unit is made to be too small, a ratio of the light emitting region in the whole device region greatly decreases leading to a problem of an organic light emitting device efficiency decrease caused by an aperture ratio decrease. Accordingly, when an organic light emitting device is manufactured with the area of the conductive unit described above, the advantages described above may be maximally exhibited while minimizing the disadvantages described above.

According to the organic light emitting device of the present specification, the conductive connection, the conductive unit, and an organic material layer including a light emitting layer may be electrically series connected to each other. The light emitting layer of the present specification is located between the first electrode and the second electrode, and the two or more light emitting layers may be electrically parallel connected to each other.

According to one embodiment of the present specification, the light emitting layer is located between the conductive unit and the second electrode, and each of the light emitting layers may be electrically parallel connected to each other. In other words, the light emitting layer of the present specification may be located corresponding to a region corresponding to the conductive unit.

When the light emitting layer of the present specification operates at the same current density, a resistance value increases in inverse proportion as the area of the light emitting layer decreases. According to one embodiment of the present specification, when the area of each of the conductive units becomes smaller and the number increases, the area of each of the light emitting layers also becomes smaller. In this case, the ratio of the voltage of the conductive connection series connected to the organic material layer decreases compared to the voltage applied to the organic material layer including the light emitting layer when the organic light emitting device operates.

When a short circuit occurs in the organic light emitting device of the present specification, the leakage current quantity may be determined by a resistance value and an operating voltage from the auxiliary electrode to the conductive unit regardless of the number of the conductive units. Accordingly, a voltage increase phenomenon by the conductive connection during normal operation may be minimized when increasing the number of the conductive units, and the leakage current quantity may also be minimized when a short circuit occurs.

According to one embodiment of the present specification, a material of the short circuit preventing unit may be the same kind as or a different kind from a material of the conductive unit. According to one embodiment of the present specification, when a material of the short circuit preventing unit is the same kind as a material of the conductive unit, a high resistance region required for short circuit prevention may be formed by adjusting the shape of the short circuit preventing unit. In addition, when a material of the short circuit preventing unit is a different kind from a material of the conductive unit, high resistance required for short circuit prevention may be obtained using a material having a higher resistance value than a material of the conductive unit.

According to one embodiment of the present specification, the short circuit preventing unit may be a short circuit preventing layer including a material different from a material of the first electrode; or a conductive connection including a material that is the same as or different from a material of the first electrode, and including a region in which a length of a current flowing direction is longer than a width of a direction vertical thereto.

According to one embodiment of the present specification, the short circuit preventing unit may be a conductive connection.

Specifically, according to one embodiment of the present specification, the first electrode further includes two or more conductive connections including a region in which a length of a current flowing direction is longer than a width of a direction vertical thereto, and in the conductive connections, each one end portion is electrically connected to the conductive unit, and the other end portion is electrically connected to the auxiliary electrode.

According to one embodiment of the present specification, a material of the conductive connection may be the same as a material of the conductive unit. Specifically, the conductive connection and the conductive unit are included in the first electrode, and may be formed with the same material.

In addition, according to one embodiment of the present specification, a material of the conductive connection may be different from a material of the first electrode, and may have resistance required for short circuit prevention by including a region in which a length of a current flowing direction is longer than a width of a direction vertical thereto.

Specifically, according to one embodiment of the present specification, the conductive connection may include a region having a length and width ratio of 10:1 or greater.

The conductive connection of the present specification may be an end portion of the conductive unit in the first electrode, and the shape or the location is not particularly limited. For example, when the conductive unit is formed in a U shape or L shape, the conductive connection may be an end portion thereof. Alternatively, the conductive connection may have a form projected in the middle of one vertex, one edge or one side of a conductive unit having a polygonal shape including a quadrangle.

According to one embodiment of the present specification, the conductive connection may have a resistance value capable of preventing short defects by including a region having a length and width ratio of 10:1 or greater. Moreover, according to one embodiment of the present specification, the region having a length and width ratio of 10:1 or greater may be the whole region of the conductive connection. Alternatively, the region having a length and width ratio of 10:1 or greater may be some regions of the conductive connection.

The length and the width of the present specification is a relative concept, and the length may mean a spatial distance from one end to the other end of the conductive connection when seen from the top. In other words, even when the conductive connection is a combination of straight lines or includes curves, the length may mean a value measuring the length assuming a straight line. The width in the present specification may mean a distance from the center of the length direction to both ends of the vertical direction of the conductive connection when seen from the top. In addition, when the width of the present specification varies, the width may be an average value of the widths of any one conductive connection. One example of the length and the width is illustrated in FIG. 1.

The length of the present specification may mean a measurement of a current flowing direction. In addition, the width of the present specification may mean a measurement of a direction vertical to the current flowing direction.

Furthermore, the length of the present specification may mean a distance that a current migrates from the auxiliary electrode to the conductive unit, and the width may mean a distance vertical to the length direction.

In FIG. 1, the distance may be a sum of a and b, and the width may be c.

According to one embodiment of the present specification, resistance between the conductive units different from each other may mean resistance of the one conductive unit and a short circuit preventing unit adjoining thereto, an auxiliary electrode, a short circuit preventing unit adjoining another conductive unit and the another conductive unit.

According to one embodiment of the present specification, the short circuit preventing unit may be a short circuit preventing layer.

According to one embodiment of the present specification, the short circuit preventing layer may include a material different from the first electrode, and specifically, the short circuit preventing layer may include a material having higher resistance than the first electrode.

According to one embodiment of the present specification, the short circuit preventing layer may be provided in the form of being laminated on a certain member, or may be provided parallel to a certain member.

According to one embodiment of the present specification, the short circuit preventing layer may be included to be provided between the first electrode and the auxiliary electrode, and the auxiliary electrode may be electrically connected to the conductive unit via the short circuit preventing layer. In other words, the auxiliary electrode of the present specification may electrically connect the conductive unit via the short circuit preventing layer. The short circuit preventing layer of the present specification may perform a short circuit preventing function of the organic light emitting device.

According to one embodiment of the present specification, the short circuit preventing layer may have a thickness of greater than or equal to 1 nm and less than or equal to 10 µm.

The short circuit preventing layer may maintain a normal operating voltage in the thickness range and/or the thickness direction resistance range described above when no short circuit occurs in an organic light emitting device. In addition, the organic light emitting device may operate in a normal range within the thickness range and/or the thickness direction resistance range described above even when a short circuit occurs in the organic light emitting device.

Specifically, according to one embodiment of the present specification, resistance of the short circuit preventing layer may mean resistance from the auxiliary electrode to the conductive connection or conductive unit. In other words, resistance of the short circuit preventing layer may be resistance according to an electrical distance in order to electrically connect from the auxiliary electrode to the conductive connection or conductive unit.

According to one embodiment of the present specification, the short circuit preventing layer may include one, two or more types selected from the group consisting of carbon powder; carbon films; conductive polymers; organic polymers; metals; metal oxides; inorganic oxides; metal sulfides; and insulating materials. Specifically, a mixture of two or more selected from the group consisting of zirconium oxide (ZrO$_2$), nichrome, indium tin oxide (ITO), zinc sulfide (ZnS) and silicon dioxide (SiO$_2$) may be used.

According to one embodiment of the present specification, one end portion of the short circuit preventing unit may be provided on at least one surface of an upper surface, a lower surface and a side surface of the conductive unit, and the other end portion of the short circuit preventing unit may be provided on at least one surface of an upper surface, a lower surface and a side surface of the auxiliary electrode.

According to one embodiment of the present specification, the conductive unit, the auxiliary electrode and the short circuit preventing unit may be provided on the same plane of the substrate.

According to one embodiment of the present specification, one end portion of the short circuit preventing unit may be provided on a side surface and an upper surface of the conductive unit, or provided on a side surface and a lower surface of the conductive unit, and the other end portion of the short circuit preventing unit may be provided on a side surface and an upper surface of the auxiliary electrode, or provided on a side surface and a lower surface of the auxiliary electrode.

According to one embodiment of the present specification, the short circuit preventing layer may be provided on at least one surface of an upper surface and a side surface of the conductive unit, and the auxiliary electrode may be provided on at least one surface of an upper surface and a side surface of the short circuit preventing layer.

According to one embodiment of the present specification, the short circuit preventing layer may be provided on at least one surface of a lower surface and a side surface of the conductive unit, and the auxiliary electrode may be provided on at least one surface of a lower surface and a side surface of the short circuit preventing layer.

According to one embodiment of the present specification, the auxiliary electrode may be disposed to be separated from each of the conductive units, and may be provided as a mesh structure surrounding one or more of the conductive units.

The auxiliary electrode of the present specification may have a structure including two or more branch points. The branch point of the present specification may include three or more branches. The auxiliary electrode is not provided with conductive lines that are not electrically connected to each other, and may be provided in a form in which two or more conductive lines partly adjoins. In other words, the auxiliary electrode of the present specification is not provided in a stripe shape, and may be provided in a form including an area in which at least two conductive lines cross to each other.

The branch point of the present specification may mean a region forming three or more branches by the auxiliary electrodes adjoining to each other, and a current of the auxiliary electrode may flow dispersively to the branches through the branch point.

According to one embodiment of the present specification, the auxiliary electrode may be disposed to be separated from the conductive unit; and a region excluding an end portion of the conductive connection adjoining the auxiliary electrode. Specifically, the auxiliary electrode may not be provided on a region having a function of preventing a short circuit of the conductive connection. In other words, the auxiliary electrode needs to be separately disposed in a region in which a length of a current flowing direction of the conductive connection is longer than a width of a direction vertical thereto. This is due to the fact that, when an auxiliary electrode having a low resistance value adjoins a region having a high resistance value, the resistance value decreases leading to decline in the short circuit preventing function.

According to one embodiment of the present specification, the first electrode may be a transparent electrode.

When the first electrode is a transparent electrode, the first electrode may be a conductive oxide such as indium tin oxide (ITO) or indium zinc oxide (IZO). Moreover, the first electrode may be a semi-transparent electrode. When the first electrode is a semi-transparent electrode, the first electrode may be prepared with a semi-transparent metal such as Ag, Au, Mg, Ca or alloys thereof. When a semi-transparent metal is used as the first electrode, the organic light emitting device may have a microcavity structure.

According to one embodiment of the present specification, the auxiliary electrode may be formed with metal materials. In other words, the auxiliary electrode may be a metal electrode.

The auxiliary electrode may generally use all metals. Specifically, aluminum, copper and/or silver having favorable conductivity may be included. When the auxiliary electrode uses aluminum for adhesion with a transparent electrode or stability in a photo process, a molybdenum/aluminum/molybdenum layer may also be used.

According to one embodiment of the present specification, the organic material layer includes at least one or more light emitting layers, and may further include one, two or more types selected from the group consisting of a hole injection layer; a hole transfer layer; a hole blocking layer; a charge generating layer; an electron blocking layer; an electron transfer layer; and an electron injection layer.

The charge generating layer means a layer generating holes and electrons when a voltage is applied.

As the substrate, a substrate having excellent transparency, surface smoothness, handling easiness and water resistance may be used. Specifically, a glass substrate, a thin glass substrate or a transparent plastic substrate may be used. The plastic substrate may include a film such as polyethylene terephthalate (PET), polyethylene naphthalate (PEN), polyether ether ketone (PEEK) and polyimide (PI) in the form of a single layer or multilayer. In addition, the substrate may include a light scattering function in the substrate itself. However, the substrate is not limited thereto, and substrates commonly used in organic light emitting devices may be used.

According to one embodiment of the present specification, the first electrode may be an anode, and the second electrode may be a cathode. In addition, the first electrode may be a cathode, and the second electrode may be an anode.

As the anode, a material having large work function is normally preferable so that hole injection to the organic material layer is smooth. Specific examples of the anode material capable of being used in the present invention include metals such as vanadium, chromium, copper, zinc and gold, or alloys thereof; metal oxides such as zinc oxides, indium oxides, indium tin oxides (ITO) and indium zinc oxide (IZO); combinations of metals and oxides such as ZnO:Al or SnO$_2$:Sb; conductive polymers such as poly(3-methylthiophene), poly[3,4-(ethylen-1,2-dioxy)thiophene] (PEDOT), polypyrrole and polyaniline, and the like, but are not limited thereto.

The materials of the anode are not limited to the anode, and may be used as a material of the cathode.

As the cathode, a material having small work function is normally preferable so that electron injection to the organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or LiO$_2$/Al, and the like, but are not limited thereto.

The materials of the cathode are not limited to the cathode, and may be used as a material of the anode.

As the hole transfer layer material according to the present specification, a material capable of receiving the holes from the anode or the hole injection layer, moving the holes to the light emitting layer, and having high mobility for the holes, is suitable. Specific examples thereof include an arylamin-based organic material, a conductive polymer, a block copolymer having conjugated parts and non-conjugated parts together, and the like, but are not limited thereto.

As the light emitting layer material according to the present specification, a material capable of emitting light in a visible region by receiving holes and electrons from the hole transfer layer and the electron transfer layer, respectively, and binding the holes and the electrons, and is preferably a material having favorable quantum efficiency for fluorescence or phosphorescence. Specific examples thereof include a 8-hydroxy-quinoline aluminum complex (Alq$_3$); a carbazole-based compound; a dimerized styryl compound; BAlq; a 10-hydroxybenzo quinolin-metal compound; a benzoxazole-, a benzthiazole- and a benzimidazole-based compound; a poly(p-phenylenevinylene) (PPV)-based polymer; a spiro compound; polyfluorene, rubrene, and the like, but are not limited thereto.

As the electron transfer layer material according to the present specification, a material capable of favorably receiving electrons from the cathode, moving the electrons to the light emitting layer, and having high mobility for the electrons, is suitable. Specific examples thereof include an Al complex of 8-hydroxyquinoline; a complex including Alq3; an organic radical compound; a hydroxyflavon-metal complex and the like, but are not limited thereto.

According to one embodiment of the present specification, the auxiliary electrode may be located in a non-light emitting region of the organic light emitting device.

According to one embodiment of the present specification, the organic light emitting device may further include an insulation layer provided in a non-light emitting region.

According to one embodiment of the present specification, the insulation layer may insulate the short circuit preventing unit and the auxiliary electrode from the organic material layer.

According to one embodiment of the present specification, the organic light emitting device may be sealed with an encapsulation layer.

The encapsulation layer may be formed with a transparent resin layer. The encapsulation layer performs a role of preventing the organic light emitting device from oxygen and contaminants, and may be a transparent material so as not to inhibit light emission of the organic light emitting device. The transparency may mean transmitting 60% or more of light, and specifically, transmitting 75% or more of light.

According to one embodiment of the present specification, the organic light emitting device may include a light scattering layer. Specifically, according to one embodiment of the present specification, the organic light emitting device may further include a substrate on a surface opposite to the surface provided with the organic material layer of the first electrode, and may further include a light scattering layer provided between the substrate and the first electrode. According to one embodiment of the present specification, the light scattering layer may include a planarization layer. According to one embodiment of the present specification, the planarization layer may be provided between the first electrode and the light scattering layer.

Alternatively, according to one embodiment of the present specification, the organic light emitting device may further include a substrate on a surface opposite to the surface provided with the organic material layer of the first electrode, and may further include a light scattering layer on a surface opposite to the surface provided with the first electrode of the substrate.

According to one embodiment of the present specification, the light scattering layer is not particularly limited as long as it has a structure inducing light scattering and capable of enhancing light detection efficiency of the organic light emitting device. Specifically, according to one embodiment of the present specification, the light scattering layer may have a structure in which scattered particles are dispersed into a binder, a film having unevenness, and/or a film having haziness.

According to one embodiment of the present specification, the light scattering layer may be directly formed on the substrate using a method such as spin coating, bar coating and slit coating, or may be formed using a method of being prepared in a film form and attached.

According to one embodiment of the present specification, the organic light emitting device may be a flexible organic light emitting device. In this case, the substrate may include a flexible material. Specifically, the substrate may be bendable thin-film-type glass, a plastic substrate or film-type substrate.

A material of the plastic substrate is not particularly limited, however, a film such as polyethylene terephthalate (PET), polyethylene naphthalate (PEN), polyether ether ketone (PEEK) and polyimide (PI) may be generally included in the form of a single layer or multilayer.

The present specification provides a display device including the organic light emitting device. The organic light emitting device may perform a role of a pixel or back light in the display device. As other constitutions of the display device, constitutions known in the art may be used.

The present specification provides an illumination device including the organic light emitting device. The organic light emitting device may perform a role of a light emitting unit in the illumination device. As other constitutions of the illumination device, constitutions known in the art may be used.

One embodiment of the present specification provides a method for manufacturing the organic light emitting device. Specifically, one embodiment of the present specification provides a method for manufacturing the organic light emitting device including preparing a substrate; forming a first electrode including two or more conductive units on the substrate; forming an auxiliary electrode disposed to be separated from the conductive units, and including two or more branch points having three or more branches; forming one or more organic material layers on the first electrode; and forming a second electrode on the organic material layer.

According to one embodiment of the present specification, the forming of a first electrode may be forming a first electrode to include two or more conductive units and a conductive connection connected to each of the conductive units.

According to one embodiment of the present specification, the forming of an auxiliary electrode may be forming an auxiliary electrode on one end portion of each of the conductive connections.

In addition, according to one embodiment of the present specification, the method for manufacturing the organic light emitting device may further include forming a short circuit preventing layer between the forming of a first electrode and the forming of an auxiliary electrode to be provided between the first electrode and the auxiliary electrode.

According to one embodiment of the present specification, the organic light emitting device may emit white light having a color temperature of greater than or equal to 2,000 K and less than or equal to 12,000 K.

One embodiment of the present specification provides a method for repairing an organic light emitting device including manufacturing an organic light emitting device including a first electrode that includes two or more conductive units, a second electrode provided opposite to the first electrode, one or more organic material layers provided between the first electrode and the second electrode, an auxiliary electrode electrically connected to each of the conductive units, and a short circuit preventing unit provided between the auxiliary electrode and each of the conductive units to electrically connect the auxiliary electrode and each of the conductive units; applying a voltage to the organic light emitting device from external power; detecting a short defect occurring conductive unit, which is detecting a white-spot region or dark-spot region of the organic light emitting device, or detecting a region having an operating temperature of 30% higher or greater than an operating temperature of a case in which no short defects occur in the organic light emitting device; detecting a short defect region in the short defect conductive unit; and repairing the short defect region by depriving a function of at least one of the first electrode and the second electrode of the short defect region.

According to one embodiment of the present specification, the applying of a voltage may further include preventing all currents being concentrated on a short defect occurring conductive unit by the short circuit preventing unit. Specifically, according to one embodiment of the present specification, when a voltage is applied to the organic light emitting device, the whole organic light emitting device not operating due to short defects may be prevented by the short circuit preventing unit, however, quantities of currents flow in the short defect region since low resistance is formed therein compared to normal regions, and the operating temperature may be 30% higher or greater than an operating temperature of a case in which no short defects occur.

According to one embodiment of the present specification, when a leakage current flowing to the short defect region is blocked below a certain level by the short circuit preventing unit, the short defect occurring conductive unit region may form a white-spot region emitting brighter light than a surrounding normally operating conductive units due to an overcurrent.

In addition, according to one embodiment of the present specification, when a leakage current flowing to the short defect region is blocked beyond a certain level by the short circuit preventing unit, a sufficient current does not flow in the short defect occurring conductive unit region, and a dark-spot region that cannot emit light may be formed.

According to one embodiment of the present specification, an overcurrent flows in the white-spot region compared to a case of normal operation, and the operating temperature may be 30% higher or greater than an operating temperature of a case in which no short defects occur.

According to one embodiment of the present specification, a current flows intensively to a short defect region in the dark-spot region as well, therefore, the operating temperature may be 30% higher or greater than an operating temperature of a case in which no short defects occur.

In order words, the white-spot region and/or the dark-spot region have a higher temperature than a normally operating conductive unit due to quantities of currents flowing to a short defect region. The normally operating conductive unit may mean a conductive unit excluding a conductive unit including a short defect region, and a conductive unit in which an overcurrent flows near the conductive unit including a short defect region.

According to one embodiment of the present specification, the applying of a voltage may further include a short defect occurring conductive unit emitting light having greater than normal brightness, or a short defect occurring conductive unit not operating.

In addition, when there are no short defect regions in the organic light emitting device, variations in the brightness and the operating temperatures of the whole light emitting region become small and are negligible.

According to one embodiment of the present specification, the detecting of a short defect occurring conductive unit may be detecting a conductive unit having a short defect region by searching a white-spot region or dark-spot region with the naked eye. In addition, the detecting of a short defect occurring conductive unit may be detecting a conductive unit having a short defect region forming a temperature 30% higher or greater than a normally operating region using an infrared camera and the like capable of detecting a temperature difference.

Moreover, according to one embodiment of the present specification, a short defect region is capable of being accurately detected by detecting a short defect region in a conductive unit that cannot emit light due to the short defect region.

Specifically, according to one embodiment of the present specification, the detecting of a short defect region may be detecting a short defect region by enlarging a conductive unit having short defects. The short defect region may be observed as an opaque region or black region. According to one embodiment of the present specification, the conductive unit may be transparent, and the short defect occurring region is opaque and may be observed as a black region.

When the short circuit preventing unit has the resistance of the above-mentioned range, the whole organic light emitting device not operating by a short defect region may be prevented. In addition, a white-spot region or dark-spot region may be generated in the organic light emitting device so as to detect a conductive unit including short defects.

According to one embodiment of the present invention, the repairing of the short defect region may be removing a first electrode or second electrode of an area including the short defect region. In addition, according to one embodiment of the present invention, the repairing of the short defect region may be depriving an electrical conducting function of a first electrode or second electrode of the short defect region. As a method of depriving an electrical conducting function of a first electrode or second electrode of the short defect region when the first electrode or second electrode is a metal electrode, the metal electrode of the short defect region may be substituted with a metal oxide.

Specifically, through the repairing of the short defect region, the short defect region is insulated, and a leakage current flowing to the short defect region may be prevented. Moreover, through the repairing of the short defect region, the short defect occurring conductive unit may normally operate. The repaired short circuit occurring region does not participate in light emission, but may not be detected with the naked eye.

According to one embodiment of the present invention, the repairing of the short defect region may be irradiating laser to a region including the short defect region.

According to one embodiment of the present invention, through the laser irradiation, a function of at least one of a first electrode, an organic material layer and a second electrode of the short defect region may be deprived. Specifically, an organic material layer of the short defect occurring region may be removed through the laser irradiation, or a function may be deprived by substituting a metal electrode of the short defect region with a metal oxide. In addition, the short defect occurring region may be removed through the laser irradiation.

Hereinafter, the present specification will be described in detail with reference to examples. However, examples according to the present specification may be modified to various other forms, and the scope of the present specification is not interpreted to be limited to the examples described below. The examples of the present specification are provided in order to more completely describe the present specification for those having average knowledge in the art.

EXAMPLE

After forming a short circuit preventing layer on a substrate, a first electrode including a plurality of conductive units was formed using ITO, and aluminum (Al) was formed in a mesh form as an auxiliary electrode. A region in which the auxiliary electrode was exposed was insulated using a photosensitive insulation material, and an organic material layer including a light emitting layer and a second electrode were laminated thereon in consecutive order, and as a result, an organic light emitting device was manufactured.

A pressure was artificially applied in some regions of the manufactured organic light emitting device to form short defects, and a short defect region was generated in some conductive unit regions. Hereinafter, a method for manufacturing an organic light emitting device according to one embodiment of the present specification blocking a leakage current by forming the short defect region into a function deprived area will be described with reference to the drawings.

Figure 2:
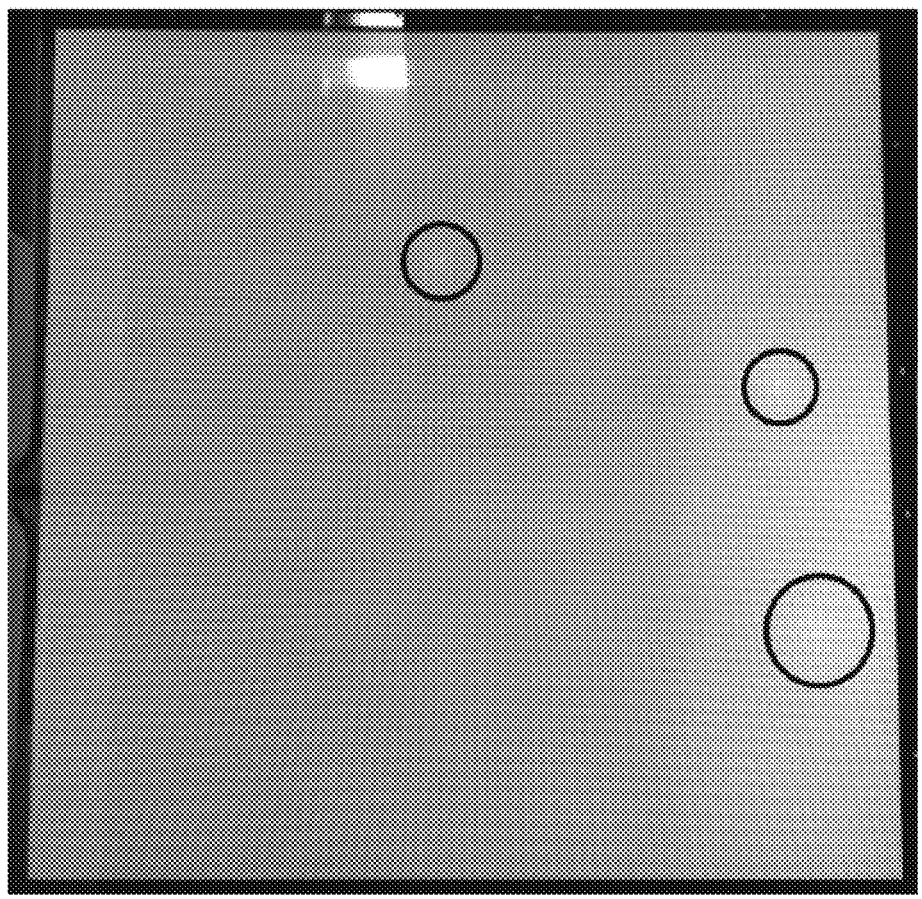
FIG. 2 and FIG. 3 show images of an organic light emitting device manufactured in an example driving.
Figure 3:
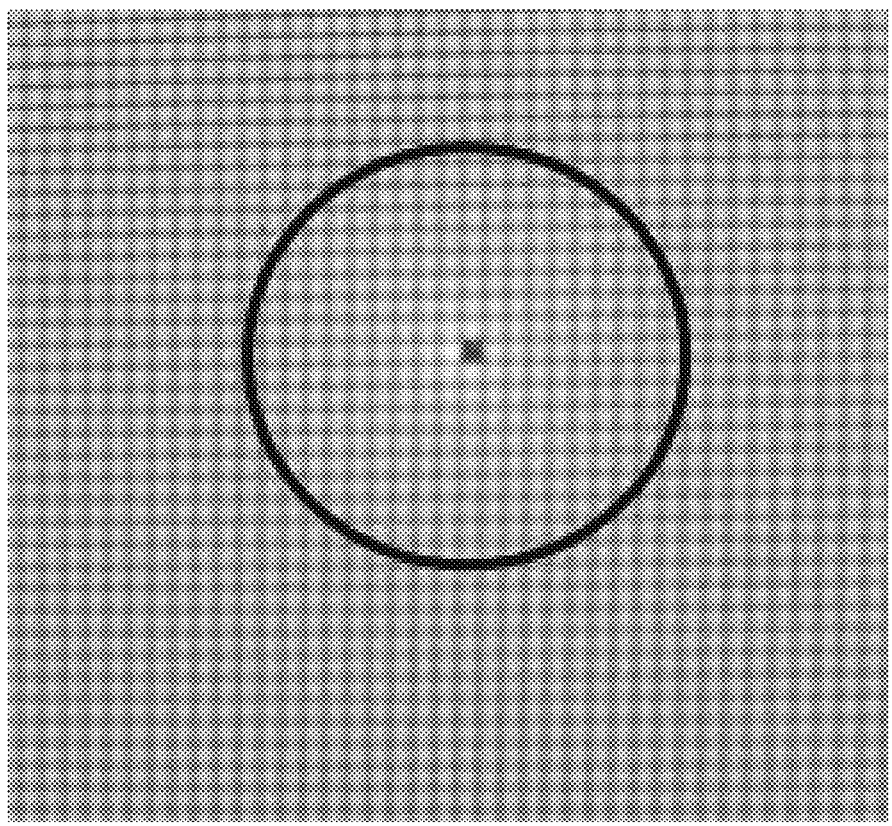

FIG. 2 and FIG. 3 show images of the organic light emitting device manufactured in the example driving.

Specifically, FIG. 2 shows white-spot regions of the organic light emitting device manufactured according to the example. As can be seen from FIG. 2, the white-spot region is a pixel including a short defect occurring conductive unit, and has higher brightness than surrounding pixels.

Specifically, FIG. 3 shows a dark-spot region of the organic light emitting device manufactured according to the example. As can be seen from FIG. 3, the dark-spot region is a pixel including a short defect occurring conductive unit, and does not emit light due to short defects.

More specifically, FIG. 2 and FIG. 3 may mean a step of detecting a short defect occurring conductive unit.

Figure 4:
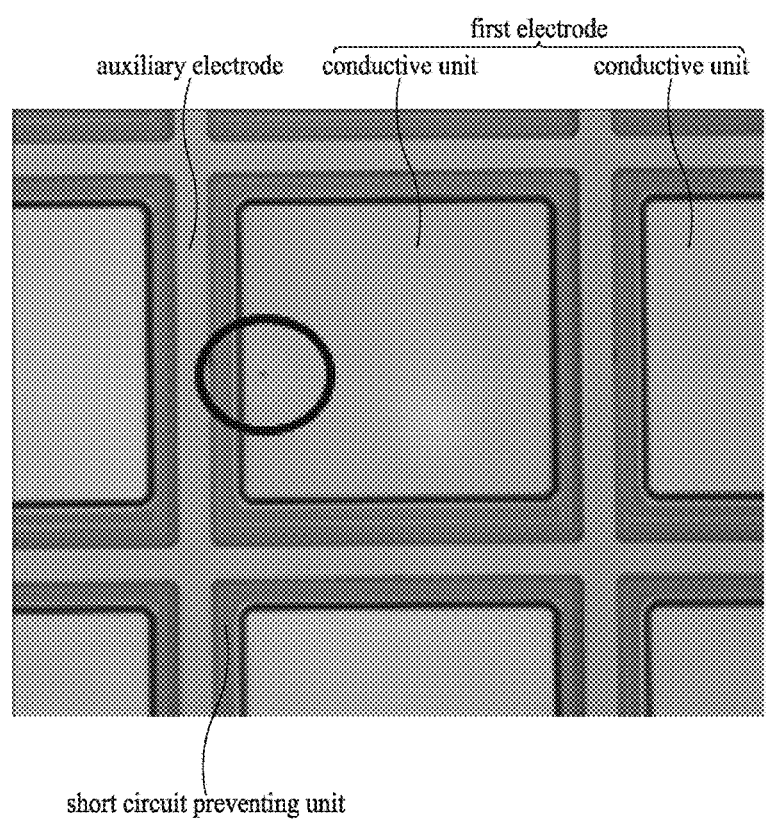
FIG. 4 is an image enlarging a short defect occurring conductive unit of an organic light emitting device manufactured according to an example.

FIG. 4 is an image enlarging the short defect occurring conductive unit of the organic light emitting device manufactured according to the example. Specifically, FIG. 4 shows a diagram enlarging the pixel including a conductive unit that does not operate due to short defects shown in FIG. 2 or FIG. 3, and finding a short defect region in the conductive unit, and may mean a step of detecting a short defect region in the short defect conductive unit. A black dot in a circle marked in FIG. 4 represents a short defect region in which the conductive unit and the second electrode adjoins to each other.

Figure 5:
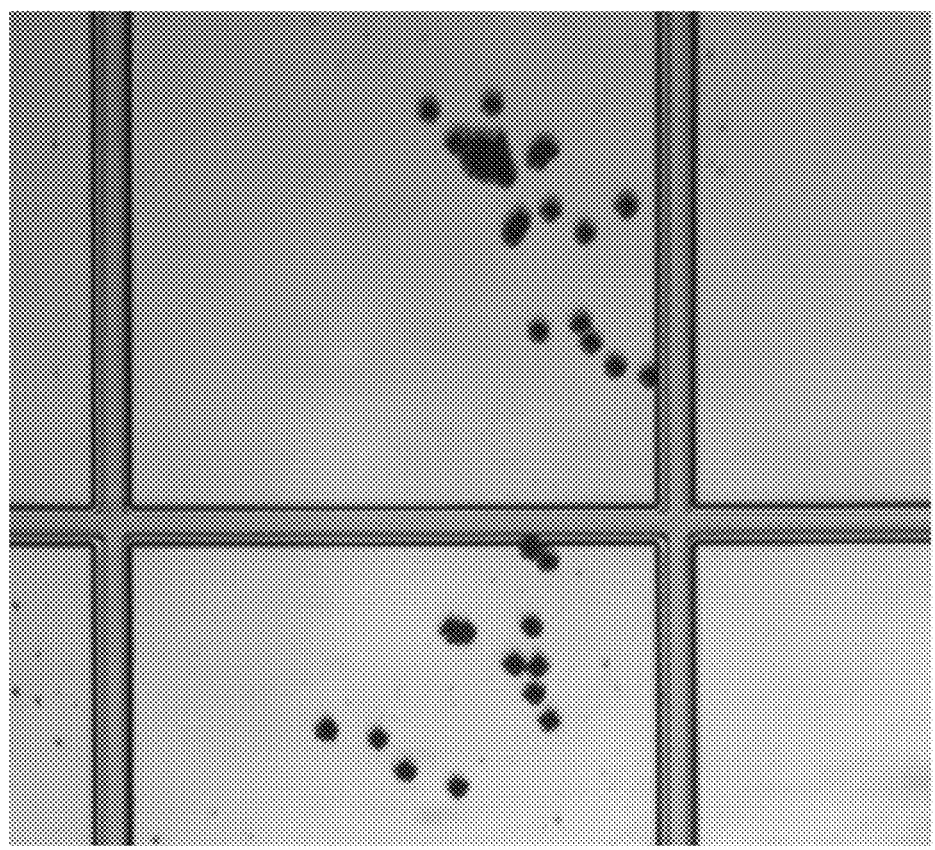
FIG. 5 and FIG. 6 are images enlarging an organic light emitting device according to one embodiment of the present specification depriving the function of a short defect region of the organic light emitting device.
Figure 6:
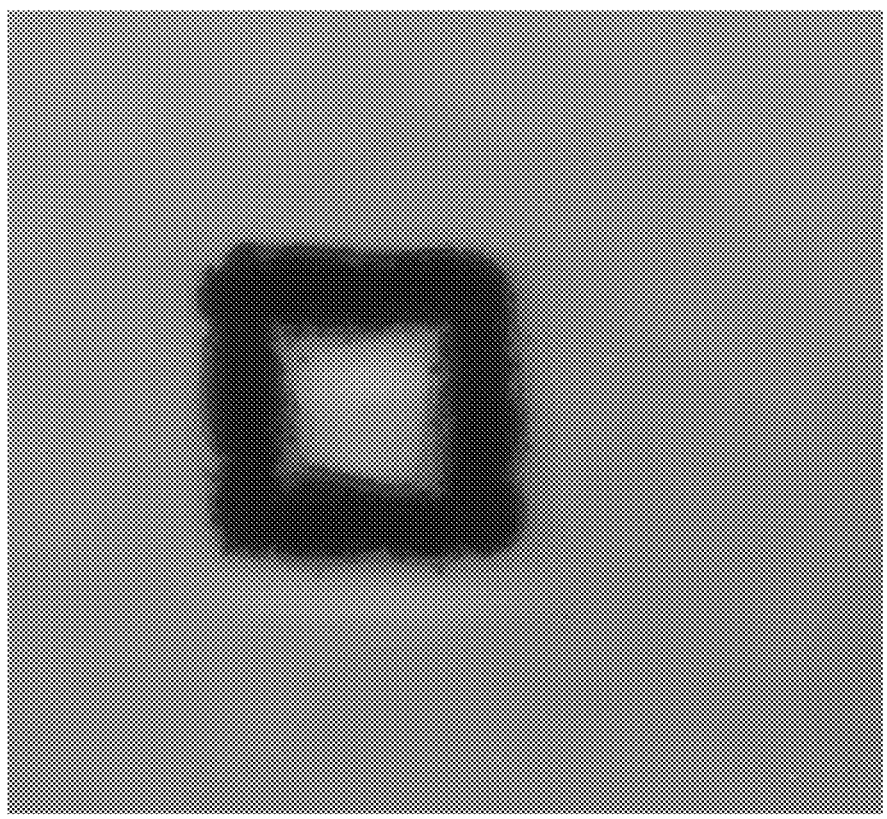
Figure 7:
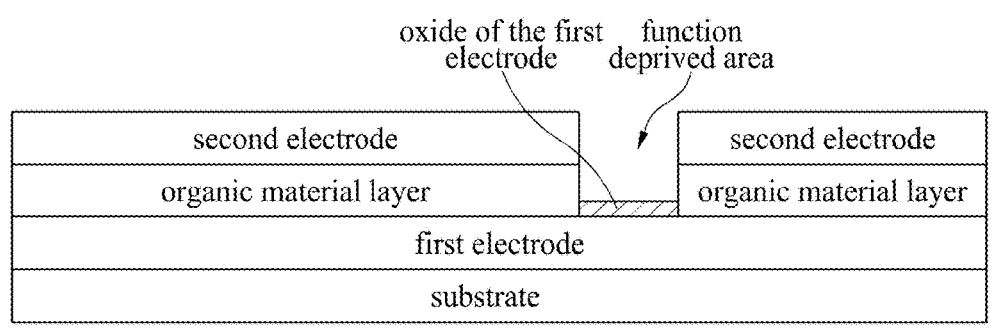
FIG. 7 illustrates an organic light emitting device having a first electrode, an organic material layer, a second electrode, a function deprived area and an oxide of the first electrode.

FIG. 5 and FIG. 6 are images showing a state of depriving a function of a short defect region of the organic light emitting device manufactured according to the example. Specifically, black regions shown in the images of FIG. 5 and FIG. 6 represent a short defect region repaired by irradiating laser to a region including the short defect region. FIG. 6 is an image enlarging any one conductive unit area in which the short defect region is repaired after laser irradiation. Specifically, FIG. 6 is a region including a short circuit occurring region being laser irradiated with laser, and the laser irradiated area in the closed figure loses the function by not being electrically connected with the surroundings. In other words, when a short circuit occurring region is large, laser irradiation may be carried out in the form of a closed figure so as to include the short circuit occurring region as in FIG. 6.

The invention claimed is:

1. An organic light emitting device comprising:
a first electrode including two or more conductive units;
a second electrode provided opposite to the first electrode;
one or more organic material layers provided between the first electrode and the second electrode; and
a function deprived area continued from a part of at least one of the conductive units to a part of the second electrode,
wherein the function deprived area is at least one of the first electrode and the second electrode losing the function or being physically removed, and
wherein the organic material layer of the function deprived area is removed, and is substituted with an oxide of the first electrode or the second electrode.

2. The organic light emitting device of claim 1, wherein the function deprived area includes a region having the shortest distance from some regions of the conductive unit to the second electrode.

3. A display device comprising the organic light emitting device of claim 2.

4. An illumination device comprising the organic light emitting device of claim 2.

5. The organic light emitting device of claim 1, wherein the function deprived area is formed by laser irradiation.

6. A display device comprising the organic light emitting device of claim 5.

7. An illumination device comprising the organic light emitting device of claim 5.

8. The organic light emitting device of claim 1, wherein an area of each of the conductive units is greater than or equal to 0.01 mm$^2$ and less than or equal to 25 mm$^2$.

9. The organic light emitting device of claim 1, which is a flexible organic light emitting device.

10. A display device comprising the organic light emitting device of claim 1.

11. An illumination device comprising the organic light emitting device of claim 1.

12. An organic light emitting device comprising:
a first electrode including two or more conductive units;
a second electrode provided opposite to the first electrode;
one or more organic material layers provided between the first electrode and the second electrode;
a function deprived area continued from a part of at least one of the conductive units to a part of the second electrode, an auxiliary electrode electrically connected to each of the conductive units; and a short circuit preventing unit provided between the auxiliary electrode and each of the conductive units to electrically connect the auxiliary electrode and each of the conductive units and, wherein the function deprived area is at least one of the first electrode and the second electrode losing the function or being physically removed.

13. The organic light emitting device of claim 12, wherein resistance from a region of the short circuit preventing unit adjacent to the auxiliary electrode to a region adjacent to each of the conductive units is greater than or equal to 40Ω and less than or equal to 300,000Ω.

14. The organic light emitting device of claim 12, wherein a material of the short circuit preventing unit is the same kind as or a different kind from a material of the conductive unit.

15. The organic light emitting device of claim 12, wherein the short circuit preventing unit is a short circuit preventing layer including a material different from a material of the first electrode; or a conductive connection including a material that is the same as or different from a material of the first electrode, and including a region in which a length of a current flowing direction is longer than a width of a direction vertical thereto.

16. The organic light emitting device of claim 12, wherein one end portion of the short circuit preventing unit is provided on at least one surface of an upper surface, a lower surface and a side surface of the conductive unit; and the other end portion of the short circuit preventing unit is provided on at least one surface of an upper surface, a lower surface and a side surface of the auxiliary electrode.

17. The organic light emitting device of claim 12, wherein the auxiliary electrode is provided as a mesh structure surrounding one or more of the conductive units.

* * * * *